(12) United States Patent
Seo

(10) Patent No.: US 9,589,881 B2
(45) Date of Patent: Mar. 7, 2017

(54) DRIVING CHIP PACKAGE AND DISPLAY DEVICE INCLUDING THE SAME

(71) Applicant: LG Display Co., Ltd., Seoul (KR)

(72) Inventor: Hyungseok Seo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/850,806

(22) Filed: Sep. 10, 2015

(65) Prior Publication Data

US 2016/0079153 A1  Mar. 17, 2016

(30) Foreign Application Priority Data

Sep. 16, 2014  (KR) ......................... 10-2014-0122911

(51) Int. Cl.
| | |
|---|---|
| *H01L 23/495* | (2006.01) |
| *H01L 23/498* | (2006.01) |
| *G02F 1/13* | (2006.01) |
| *G02F 1/1345* | (2006.01) |
| *H05K 3/36* | (2006.01) |

(52) U.S. Cl.
CPC ...... *H01L 23/49838* (2013.01); *G02F 1/1309* (2013.01); *G02F 1/13452* (2013.01); *H01L 23/4985* (2013.01); *H05K 3/361* (2013.01); *G02F 2201/50* (2013.01); *H01L 2924/0002* (2013.01)

(58) Field of Classification Search
CPC .......... H01L 23/4985; H01L 23/49838; H01L 2924/0002
USPC ....................................................... 257/668
See application file for complete search history.

(56) References Cited

U.S. PATENT DOCUMENTS

| | | | |
|---|---|---|---|
| 5,208,559 A * | 5/1993 | Jordan | H03K 7/08 327/176 |
| 5,398,128 A * | 3/1995 | Tajima | H01L 23/145 257/E23.007 |
| 5,402,255 A * | 3/1995 | Nakanishi | G02F 1/13452 257/E23.065 |
| 5,838,412 A | 11/1998 | Ueda et al. | |
| 6,204,567 B1 * | 3/2001 | Imamura | G02F 1/1345 257/207 |
| 6,266,119 B1 * | 7/2001 | Takahashi | G02F 1/13452 349/149 |
| 6,407,795 B1 | 6/2002 | Kamizono et al. | |
| 6,559,549 B1 * | 5/2003 | Cho | H01L 23/4985 257/678 |
| 8,617,910 B2 * | 12/2013 | Lee | G02F 1/13452 257/797 |
| 2001/0026008 A1 * | 10/2001 | Tsuneda | H01L 23/49811 257/668 |
| 2008/0002131 A1 | 1/2008 | Koh | |
| 2008/0174979 A1 * | 7/2008 | Furihata | H05K 1/0269 361/807 |

(Continued)

OTHER PUBLICATIONS

European Patent Office, Search Report and Opinion, European Patent Application No. 15185518.6, Jan. 15, 2016, eight pages.

*Primary Examiner* — Nitin Parekh
(74) *Attorney, Agent, or Firm* — Fenwick & West LLP

(57) ABSTRACT

A display device includes a display panel and a chip-on-film (COF) bonded to the display panel. The chip-on-film includes a film on which a driving chip is mounted, a plurality of film lines on the film, and at least one dummy pattern on the film between an adjacent pair of films in the plurality of film lines.

10 Claims, 16 Drawing Sheets

(56) References Cited

U.S. PATENT DOCUMENTS

2009/0044967 A1* 2/2009 Nakahama ........ H01L 23/49838
   174/250
2015/0279792 A1* 10/2015 Matsui ................ G02F 1/13452
   257/737

* cited by examiner

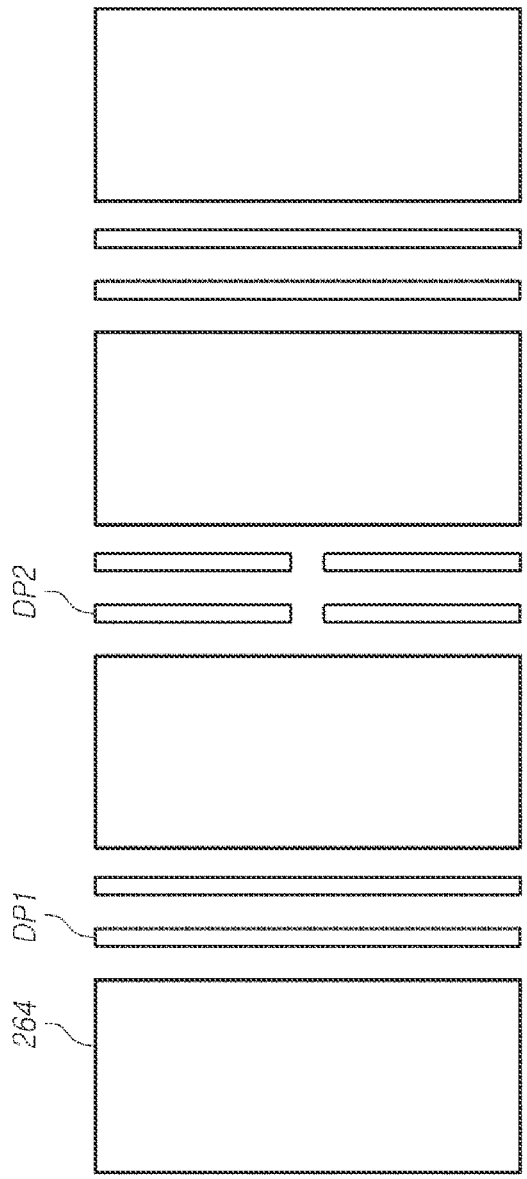

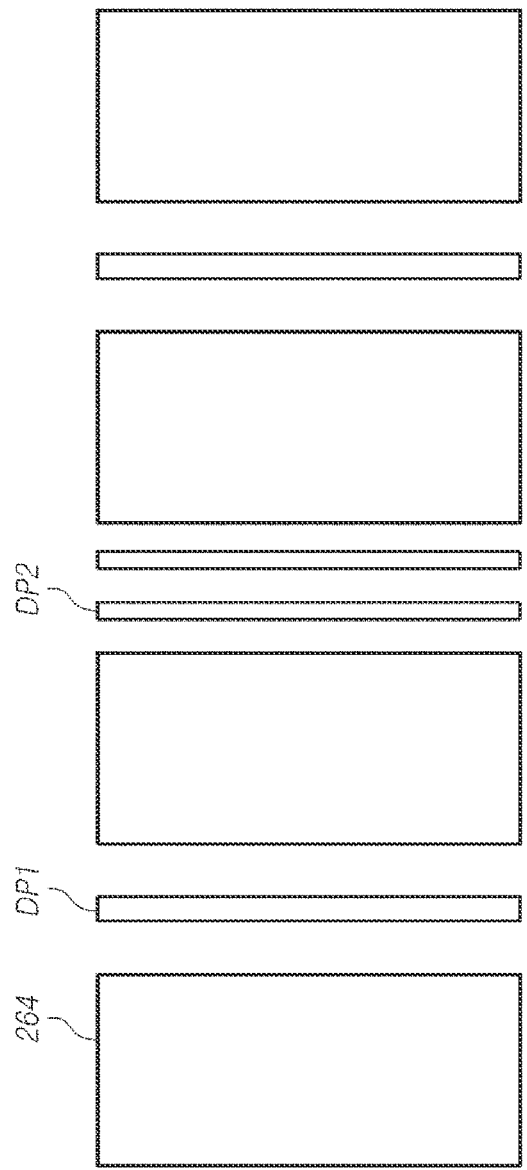

DRIVING CHIP PACKAGE AND DISPLAY DEVICE INCLUDING THE SAME

CROSS REFERENCE TO RELATED APPLICATION

This application claims priority from and the benefit under 35 U.S.C. §119(a) of Republic of Korea Patent Application Number 10-2014-0122911 filed on Sep. 16, 2014, which is hereby incorporated by reference for all purposes as if fully set forth herein.

BACKGROUND OF THE INVENTION

Field of the Invention

The present invention relates to a driving chip package and a display device including the same.

Description of Related Art

Flat panel display devices allowing for reductions in the weight and volume of products, which may be excessively large with the use of cathode ray tubes (CRTs), have recently been developed. Flat panel display devices include plasma display panels (PDPs), organic light-emitting diode (OLED) display devices, electrophoretic display devices (EPDs), and the like.

Typically, flat panel display devices include a display panel on which pixels are defined by a plurality of gate lines and a plurality of data lines intersecting the plurality of gate lines; a gate driver driving the plurality of gate lines; a data driver including a plurality of data driver integrated circuits (ICs) driving the plurality of data lines; a timing controller supplying a variety of control signals to the gate driver and the data driver; and a voltage generator generating reference voltages and supplying the reference voltages to the data driver.

According to current trends, such a gate driver is disposed within a non-active area of a display panel in order to reduce the volume and fabrication costs of flat display devices, and such a plurality of data driver ICs are disposed on a film using a chip-on-film (COF) method.

The film on which the data driver ICs is mounted is bonded to the non-active area in the periphery of the display panel. When alignment is not accurate, a repairing process must be undertaken. At this time, electric lines of the display panel may be torn, due to an adhesive used therein, such that display panels may not be able to be re-used, which is problematic.

BRIEF SUMMARY OF THE INVENTION

Various aspects of the present invention provide a chip-on-film (COF) and a display device including the same able to prevent electric lines from being torn during repairing process.

Embodiments relate to a display device including a display panel having a bonding area in which signal lines are disposed, a chip-on-film bonded to the display panel. The chip-on-film includes a film, a plurality of film lines on the film, and at least one dummy pattern. The film includes a mounted driving chip, and includes a bonding portion adhered to the bonding area of the display panel using an adhesive material. The plurality of film lines on the film carries signals to the signal lines on the display panel. The film lines extend to the bonding portion of the film. The at least one dummy pattern is on at least the bonding portion of the film and extends between a first pair of film lines in the plurality of film lines. The at least one dummy pattern is electrically isolated from the plurality of film lines.

In one embodiment, the adhesive material is anisotropic conductive film (ACF).

In one embodiment, one or more of the at least one dummy pattern is disposed between every pair of adjacent film lines in the plurality of film lines.

In one embodiment, the width of each of the film lines is greater than a width of the at least one dummy pattern.

In one embodiment, the at least one dummy pattern comprises at least two dummy patterns, and a distance between a film line in the first pair of film lines and a dummy pattern adjacent to the film line in the at least one dummy pattern is identical with a distance between each adjacent pair of dummy patterns in the at least one dummy pattern.

In one embodiment, the plurality of film lines is electrically connected to a printed circuit board.

In one embodiment, the plurality of film lines is electrically connected to signal lines on the display panel.

In one embodiment, the at least one dummy pattern is electrically isolated from the signal lines on the display panel.

In one embodiment, the at least one dummy pattern is a line extending along a direction in which each of the plurality of film lines extends.

In one embodiment, the at least one dummy pattern comprises a plurality of dummy pattern sections spaced apart from each other along a direction in which each of the plurality of film lines extend.

In one embodiment, the at least one dummy pattern is shaped as a line extending along a direction perpendicular to a direction along which each of the plurality of film lines extend.

Embodiments also relate to a chip-on-film including a film, a plurality of film lines on the film, and at least one dummy pattern. The film includes a mounted driving chip, and includes a bonding portion a bonding portion adhered to a bonding area of a display panel using an adhesive material. The plurality of film lines on the film carries signals to signal lines on the display panel. The film lines extend to the bonding portion of the film. The at least one dummy pattern is on at least the bonding portion of the film and extends between a first pair of film lines in the plurality of film lines. The at least one dummy pattern is electrically isolated from the plurality of film lines.

In one embodiment, one or more of the at least one dummy pattern is disposed between every pair of adjacent film lines of in the plurality of film lines.

In one embodiment, one end of the plurality of film lines is connected to a printed circuit board, and the other end of the plurality of film lines is connected to signal lines on the display panel.

In one embodiment, a width of each of the film lines is greater than a width of the at least one dummy pattern.

In one embodiment, the at least one dummy pattern comprises at least two dummy patterns, and a distance between a film line in the plurality first pair of film lines and a dummy pattern adjacent to the film line in the at least one dummy pattern is identical with or different from a distance between each adjacent pair of dummy patterns of in the at least one dummy pattern.

In one embodiment, the at least one dummy pattern is shaped as a line extending along a direction in which each of the plurality of film lines extend.

In one embodiment, the at least one dummy pattern comprises a plurality of dummy pattern sections spaced apart from each other along a direction in which each of the plurality of film lines extend.

In one embodiment, the at least one dummy pattern is shaped as a line extending along a direction perpendicular to a direction along which each of the plurality of film lines extend.

In one embodiment, a second pair of film lines in the plurality of film lines is adjacent to each other without dummy patterns in between the second pair.

According to the present invention, when the chip-on-film or the display device including the same is repaired, electric lines are prevented from being torn.

BRIEF DESCRIPTION OF THE DRAWINGS

The above and other objects, features and advantages of the present invention will be more clearly understood from the following detailed description when taken in conjunction with the accompanying drawings, in which:

FIG. 6 to FIG. 11 are schematic top-plan views illustrating a variety of forms of film lines and dummy patterns;

DETAILED DESCRIPTION OF THE INVENTION

Figure 1:
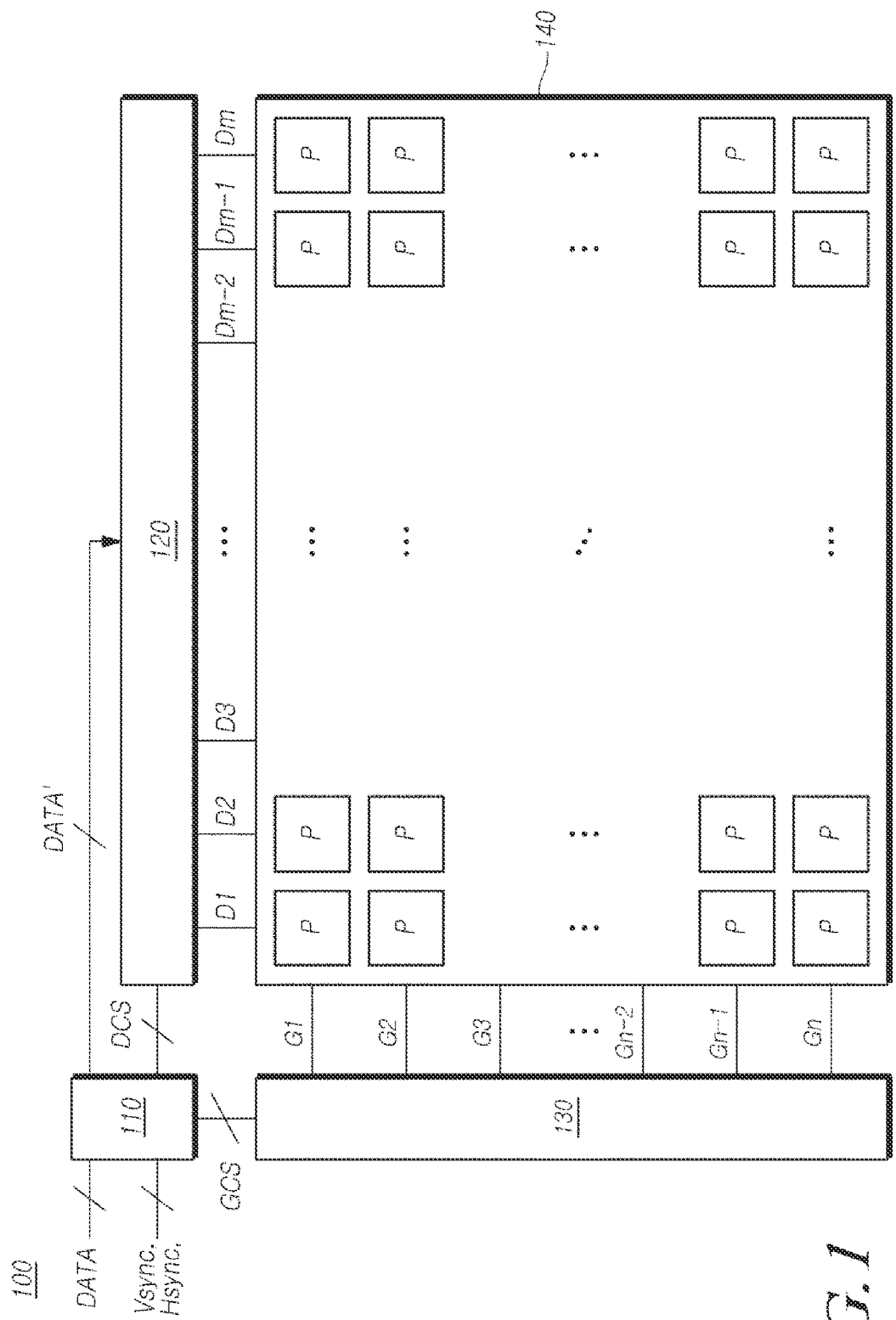
FIG. 1 is a schematic diagram illustrating the system configuration of a display device to which embodiments of the present invention are applied.

Reference will now be made in detail to embodiments of the present invention, examples of which are illustrated in the accompanying drawings. Throughout this document, reference should be made to the drawings, in which the same reference numerals and signs will be used to designate the same or like components. In the following description of the present invention, detailed descriptions of known functions and components incorporated herein will be omitted in the case that the subject matter of the present invention may be rendered unclear thereby.

It will also be understood that, although terms such as "first," "second," "A," "B," "(a)" and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected" or "coupled to" the other element, but also can it be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a schematic diagram illustrating the system configuration of a display device to which embodiments of the present invention are applied.

Referring to FIG. 1, the display device 100 includes a display panel 140 on which m number of data lines D1 to Dm (where m is a natural number) and n number of gate lines G1 to Gn (where n is a natural number) are disposed; a data driver 120 driving the m number of data lines D1 to Dm; a gate driver 130 sequentially driving the n number of gate lines G1 to Gn; and a timing controller 110 controlling the data driver 120 and the gate driver 130.

The timing controller 110 outputs data control signals DCS to control the data driver 120 and gate control signals GCS to control the gate driver 130, based on external timing signals, such as vertical/horizontal synchronization signals Vsync and Hsync, image data Data, clock signals CLK, and the like, based on the input from a host system. In addition, the timing controller 110 can convert the image data Data input from the host system into a data signal format used in the data driver 120 and can supply the converted image data Data' to the data driver 120.

In response to the data control signals DCS and the converted image data Data' input from the timing controller 110, the data driver 120 converts the image data Data' to data signals (analog pixel signals or data voltages), i.e. voltage values corresponding to grayscales, and supplies the converted data signals to the m number of data lines D1 to Dm.

Specifically, under the control of the timing controller 110, the data driver 120 drives the m number of data lines D1 to Dm by previously saving the input image data Data in a memory (not shown), converting the corresponding image data Data to analog data voltages Vdata, and subsequently supplying the analog data voltages Vdata to the m number of data lines D1 to Dm.

The data driver 120 includes a plurality of data driver integrated circuits (ICs). (The data driver ICs are also referred to as the "source driver ICs.") The plurality of data driver ICs may be connected to the bonding pads of the display panel 140 by a tape-automated bonding (TAB) method or a chip-on-glass (COG) method, may be implemented as a chip-on-film (COF)-type driving chip package (not shown) connected to the display panel 140 by a film-on-glass (FOG) method, or may be directly disposed on the display panel 140. In some cases, each of the plurality of data driver ICs may be integrated with the display panel 140.

When the COF-type driving chip package (not shown) is formed using the FOG method, the driving chip package includes a film (not shown) on which a driving chip (not shown) is mounted, a plurality of film lines (not shown) disposed on the film (not shown), and at least one dummy line (herein after called "dummy pattern," not shown) disposed on the film (not shown) between the adjacent film lines of the plurality of film lines (not shown).

One end of the film lines (not shown) of the film (not shown) is electrically connected to a printed circuit board (PCB), and the other end of the film lines (not shown) of the film (not shown) is electrically connected to a non-active area (not shown), or a peripheral area, of the display panel 140. The film lines (not shown) are connected to the data lines D1 to Dm disposed on the display panel 140.

In addition, the driving chip package (not shown) may be bonded to a bonding area (not shown) on the display panel 140 of the display device 100 in which the data lines D1 to Dm are disposed. At least one dummy pattern (not shown) may be disposed between every pair of adjacent film lines (not shown).

The gate driver 130 sequentially supplies scanning signals (gate pulses or scanning pulses and gate on signals) to the gate lines G1 to Gn in response to a gate control signal input from the timing controller 110.

As illustrated in FIG. 1, the driver 130 is positioned on one side of the display panel 110. In some cases, the gate driver 130 may be divided into two sections positioned on opposite sides of the display panel 110.

The gate driver 130 includes a plurality of gate driver ICs. The plurality of gate driver ICs may be connected to the bonding pads of the display panel 140 by a tape-automated bonding (TAB) method or a chip-on-glass (COG) method or may be implemented as a gate-in-panel (GIP)-type ICs directly disposed on the display panel 140. In some cases, each of the plurality of gate driver ICs may be integrated with the display panel 140.

Although the gate driver 130 has been illustrated as a GIP-type driver positioned on one side of the display panel in this disclosure, it should be understood that the display device 100 according to the present invention is by no means limited thereto.

Pixels P on the display panel 140 are disposed in the areas defined by the data lines D1 to Dm and the gate lines G1 to Gn such that the pixels P are arranged in a matrix. For example, when the display panel 140 is an organic light-emitting diode (OLED) display panel, circuit devices, such as an organic light-emitting diode (OLED) including a pixel electrode (or an anode) acting as a first electrode, a cathode acting as a second electrode, an organic layer, and the like; two or more transistors; and one or more capacitors, are disposed thereon.

Figure 2:
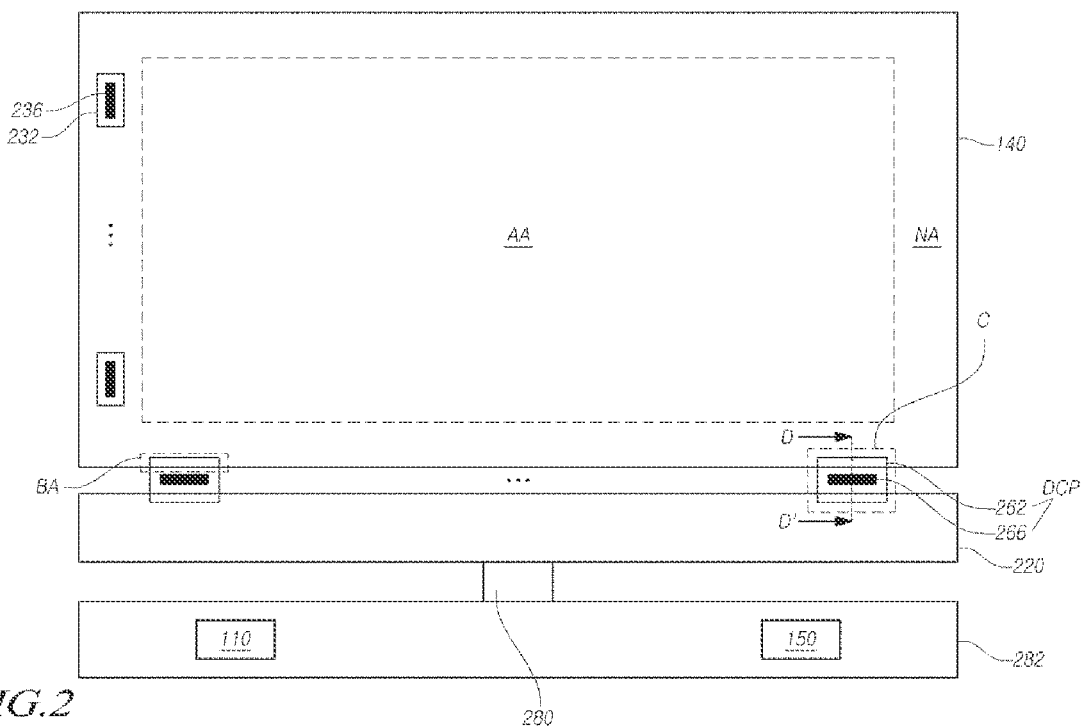
FIG. 2 is a schematic top-plan view illustrating the display device to which embodiments of the present invention are applied.

FIG. 2 is a schematic top-plan view illustrating the display device to which embodiments of the present invention are applied.

FIG. 2 is an exemplary view illustrating the display device 100 and driving chip packages DCP applied to the display device 100 according to an exemplary embodiment of the present invention. However, the present invention is not limited thereto.

Referring to FIG. 2, the display device 100 includes the display panel 140 and the chip-on-film (COF) driving chip packages DCP bonded to the display panel 140.

Each of the driving chip packages DCP includes a film 262 on which a driving chip 266 is mounted, a plurality of film lines (not shown) disposed on the film 262, and at least one dummy pattern (not shown) disposed on the film 262 between the plurality of film lines (not shown).

In addition, the driving chip package DCP may be attached to the display panel 140 by means of a conductive adhesive (not shown) by a film-on-glass (FOG) method.

The display panel 140 of the display device 100 is divided into an active area AA and a non-active area NA. The non-active area NA is disposed surrounding the active area AA, i.e. on the periphery of the display panel 140. In the active area AA, the plurality of gate lines G1 to Gn intersect the plurality of data lines D1 to Dn, such that the pixels P are defined at the intersecting points.

In addition, on one side of the non-active area NA (the left part of the display panel 140 in FIG. 2), gate driving chips (i.e. gate driver ICs) 236 and gate driving chip films 232 on which the gate driving chips 236 are mounted are disposed by a gate-in-panel (GIP) method.

The gate driving chip films 232 are bonded to a substrate (not shown) of the display panel 140 by a line-on-glass (LOG) method such that the gate driving chip films 232 are connected to electric lines and the gate lines G1 to Gn disposed on the non-active area NA. Although the two gate driving chip films 232 are illustrated in FIG. 2, the number of the gate driving chip films 232 may increase with an increase in the size of the display panel 140. The gate driving chips 236 may be bonded to the right and left parts of the display panel 140 when the size of the display panel 140 is increased. The gate driving chips 236 sequentially supply gate pulses to the gate lines G1 to Gn.

A plurality of driving chip packages DPC is disposed on the lower portions of the non-active area NA. Each lower end of the driving chip packages DPC is connected to a source printed circuit board (SPCB) 220.

The driving chip 266 may be a source driver IC. The driving chip 266 is disposed within the film 262. The film 262 may be a source flexible circuit film. Input terminals of the film 262 are bonded to the SPCB 220 and the substrate (not shown) of the display panel 140 by means of an anisotropic conductive film (ACF, not shown). Image data and timing control signals are transmitted to the driving chip 266 through line-on-film (OLF)-type electric lines disposed on the SPCB 220 and the film 262.

The driving chip 266 receives image data Data from the timing controller 110, generates data voltages by converting the image data using an analog-to-digital converter (ADC), and supplies the converted image data to the data lines D1 to Dm.

Each of the driving chip packages DCP disposed on the corresponding film 262 may include at least one dummy pattern (not shown) disposed between the plurality of film lines (not shown). The dummy patterns (not shown) serve to prevent LOG-type signal lines from being torn during repairing process.

Specifically, after the fabrication of the display panel 140, a process of bonding the driving chip package DCP to the display panel 140 is carried out. When film lines (264, see FIG. 3 and FIG. 5) of the driving chip package DCP are not accurately aligned with the signal lines of the display panel 140, a repairing process of detaching the driving chip package DCP from the display panel 140 and reattaching the driving chip package DCP to the display panel 140 is undertaken. At this time, the signal lines on the substrate 242 of the display panel 140 may be detached along with the driving chip package DCP. This is caused by the bonding force of an anisotropic conductive film (not shown). According to the present embodiment, the dummy pattern (not shown) can reduce the bonding force, thereby preventing the signal lines from being torn.

The SPCB 220 is connected to a control printed circuit board (CPCB) 282 via a flexible circuit cable 280. The CPCB 282 may include the timing controller 110 and a power driving chip 150.

The SPCB 220 has electric lines thereon through which power and signals necessary for driving the driving chips 266 and the gate driving chips 236 are transmitted. The SPCB 220 may be divided into a plurality of sections bonded to the display panel 140 depending on the size of the display panel 140.

Circuits, such as the timing controller 110 and the power driving chip 150, are mounted on the CPCB 282.

As described above, the timing controller 110 outputs data control signals DCS for controlling the data driver 120 to the driving chips 266 and gate control signals GCS for controlling the gate driver 130 to the gate driving chips 236, based on external timing signals, such as vertical/horizontal synchronization signals Vsync and Hsync, image data Data, clock signals CLK, and the like, based on the input from the host system. In addition, the timing controller 110 converts image data Data input from the host system into a data signal format used in the data driver 120 and supplies the converted image data Data' to the driving chips 266.

The host system may be one selected from among a TV system, a set-top box, a navigation system, a digital versatile disc (DVD), a Blu-ray player, a personal computer (PC), a home theatre, and a phone system.

The power driving chip 150 generates power to be applied to the pixels P, power for the driving chips 266 and the gate driving chips 236, gamma compensation voltages (VGMA), gate driving voltages VGH and VGL, and the like.

The driving chip packages DCP may be bonded to bonding areas BA of the display panel 140 on which the data lines D1 to Dm are disposed by means of a conductive adhesive.

The bonding areas BA may be defined on the non-active area NA positioned surrounding the active area AA, i.e. on the periphery of the display panel 140. The bonding areas BA refer to the areas in which the driving chip packages DCP are bonded to the substrate (not shown) of the display panel 140.

Figure 3:
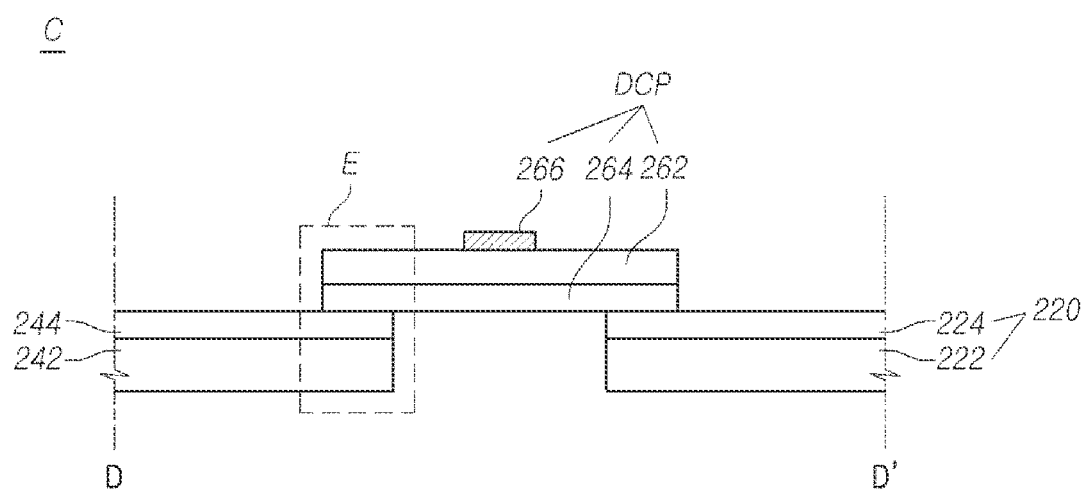
FIG. 3 is a schematic cross-sectional view of the area C in FIG. 2 taken along line D-D'.

FIG. 3 is a schematic cross-sectional view of the area C in FIG. 2 taken along line D-D'.

FIG. 3 more specifically illustrates the cross-section of the area of the display device 100 in which one of the driving chip packages DCP is disposed.

Referring to FIG. 3, the display device 100 includes signal lines 244 disposed on the substrate 242 and the driving chip packages DCP attached on top of the signal lines 244 by an FOG method. In addition, the display device 100 includes the SPCB 220 positioned opposite the substrate 242 of the display panel 140, with the driving chip packages DCP being positioned between the SPCB 220 and the substrate 242. Portions of the SPCB 220 are attached to the driving chip package DCP.

Each of the driving chip packages DCP includes the film 262, the driving chip 266 mounted on the central portion of the film 262, and the film lines 264 disposed on the undersurface of the film 262. The film lines 264 are connected at one end to the signal lines 244 disposed on the substrate 242 of the display panel 140 and are electrically connected at the other to source printed circuit lines 224 disposed on the base substrate 222 of the SPCB 220.

The driving chip 266 may be a source driver IC, and the signal lines 244 on the substrate 242 may be link lines connected to the data lines D1 to Dm.

In addition, the areas in which the film lines 264 are connected to the signal lines 244 may be the bonding areas BA positioned in the non-active area NA of the display panel 140.

The SPCB 220 bonded to the driving chip package DCP is bent such that the SPCB 220 can be attached to the rear surface (back surface) of the display panel 140. In this case, the film 262 of the driving chip package DCP may be a flexible film.

Figure 4:
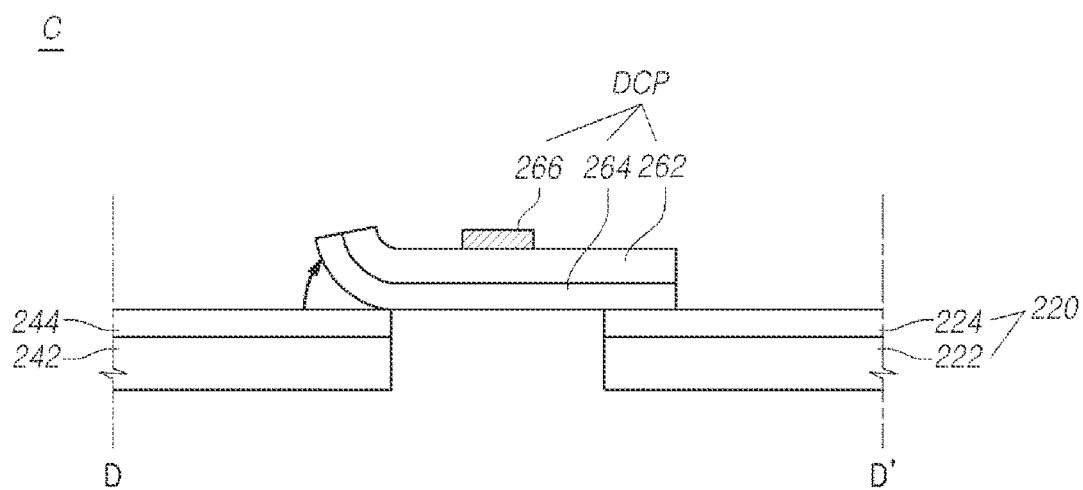
FIG. 4 is a schematic cross-sectional view illustrating a part of a repairing process for the display panel and the driving chip package of the display device according to an exemplary embodiment of the present invention.

FIG. 4 is a schematic cross-sectional view illustrating a part of a repairing process for the display panel 140 and the driving chip package DCP of the display device according to an exemplary embodiment of the present invention.

In a process of fabricating the display device 100, after the display panel 140 is fabricated, the driving chip package DCP is bonded to the display panel 140. When the film lines 264 are not accurately aligned with the signal lines 244 of the display panel 140, the repairing process of detaching and reattaching the driving chip package DCP from and to the display panel 140 may be undertaken. In the repairing process, at least a portion of the signal lines 244 may be detached along with the driving chip package DCP, due to the bonding force of the anisotropic conductive film (not shown). This is because the signal lines 244 are strongly bonded to the anisotropic conductive film (not shown) since the space between the adjacent film lines 264 is relatively wide. Consequently, when the driving chip package DCP is reattached to the display panel 140, the display panel 140 may malfunction or may suffer from a short circuit, which is problematic.

In order to overcome this problem, the dummy pattern (not shown) is disposed between the adjacent film lines 264. The dummy pattern (not shown) can prevent the signal line from being torn by reducing the bonding force, thereby increasing the yield of the repairing process.

The structure and effects of the dummy pattern (not shown) will be now described in more detail.

Figure 5:
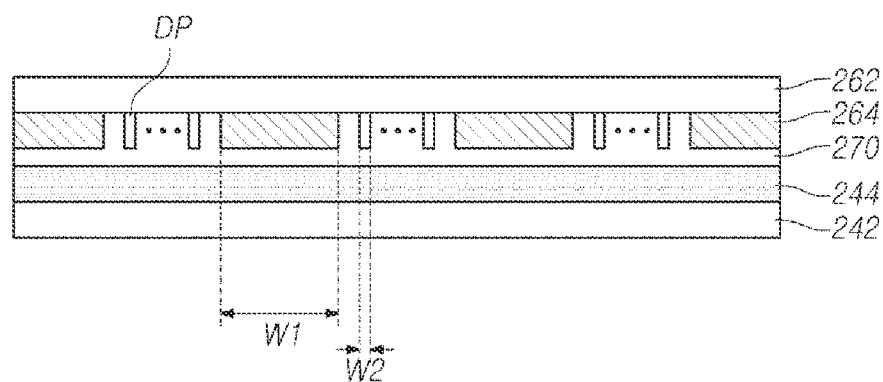
FIG. 5 is an enlarged cross-sectional view of the part E in FIG. 3.

FIG. 5 is an enlarged cross-sectional view of the part E in FIG. 3.

Referring to FIG. 5, the display device 100 includes the substrate 242 of the display panel 140, the LOG-type signal lines 244 disposed on the substrate 242, and the driving chip packages DCP bonded to the signal lines 244. Each of the driving chip packages DCP includes the film 262 on which the driving chip 266 is mounted, the plurality of film lines 264 disposed on the film 262, and at least one dummy pattern DP disposed between the plurality of film lines 264. The driving chip packages DCP are bonded to the signal lines 244 by means of a conductive adhesive 270 by a film-on-glass (FOG) method.

The substrate 242 of the display panel 140 on which transistors or storage capacitors are disposed may not only be a glass substrate, but also a plastic substrate formed of, for example, polyethylene terephthalate (PET), polyethylene naphthalate (PEN), or polyimide.

The signal lines 244 are formed of a metal material, for example, copper (Cu). The signal lines 244 may be link lines connected to the data lines D1 to Dm.

The conductive adhesive 270 serves to bond the driving chip package DCP and the substrate 242 to each other. The conductive adhesive 270 may be, for example, an anisotropic conductive film (ACF).

The film lines 264 disposed on the film 262 may be formed of a metal or an alloy. A plurality of dummy patterns DP is disposed between the film lines 264. The dummy patterns DP are intended to decrease the bonding strength of the driving chip package DCP, and are not connected to the signal lines 244 disposed on the substrate 242 of the display panel 140.

The film lines 264 may be electrically connected to the signal lines 244 of the display panel 140 and the SPCB 220.

At least one dummy pattern DP may be disposed between every pair of adjacent film lines 264 of the plurality of film lines 264. For example, n number of dummy patterns DP (where n is a natural number) may be disposed between every pair of adjacent film lines 264.

The width W1 of each film line 264 is greater than the width W2 of each dummy pattern DP, but this is not intended to be limiting. The distance between each film line 264 and the adjacent dummy pattern DP may be identical with or different from the distance between the adjacent dummy patterns DP. The film lines 264 and the dummy patterns DP of the display device according to the present invention are not limited thereto and may have a variety of other widths and distances.

In addition, it should be understood that the shape or arrangement of the dummy patterns is not limited to those illustrated in the accompanying drawings and a variety of other designs are possible.

Descriptions of a variety of examples of the dummy patterns will be given below with reference to the drawings.

FIG. 6 to FIG. 11 are schematic top-plan views illustrating a variety of forms of the film lines and the dummy patterns.

Figure 6:
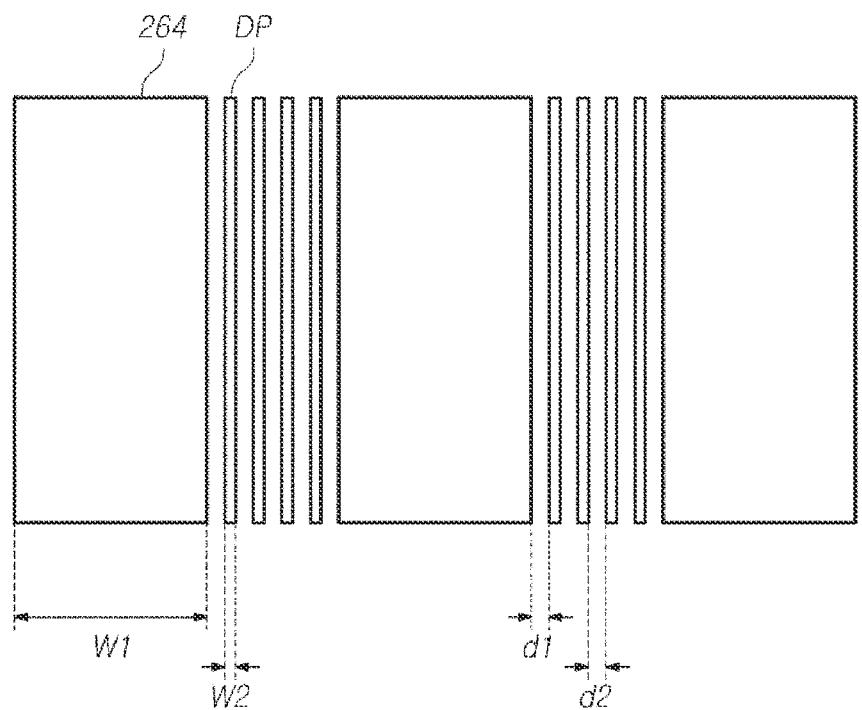

Referring to FIG. 6, in a driving chip package DCP of the display device 100, the width W1 of each film line 264 is greater than the width W2 of each dummy pattern DP (W1>W2). However, this is not intended to be limiting. The distance d1 between each film line 264 and the adjacent dummy pattern DP may be identical with or different from the distance d2 between the adjacent dummy patterns DP. FIG. 6 illustrates an example in which four dummy patterns DP are disposed between every pair of adjacent film lines 264.

Consequently, the amount of the conductive adhesive 270 is reduced in the area in which the dummy patterns DP are disposed, so the bonding force between the conductive adhesive 270 and the signal lines 244 can be reduced. It is therefore possible to prevent the signal lines 244 from being torn along with the driving chip package during repairing process.

Figure 7:
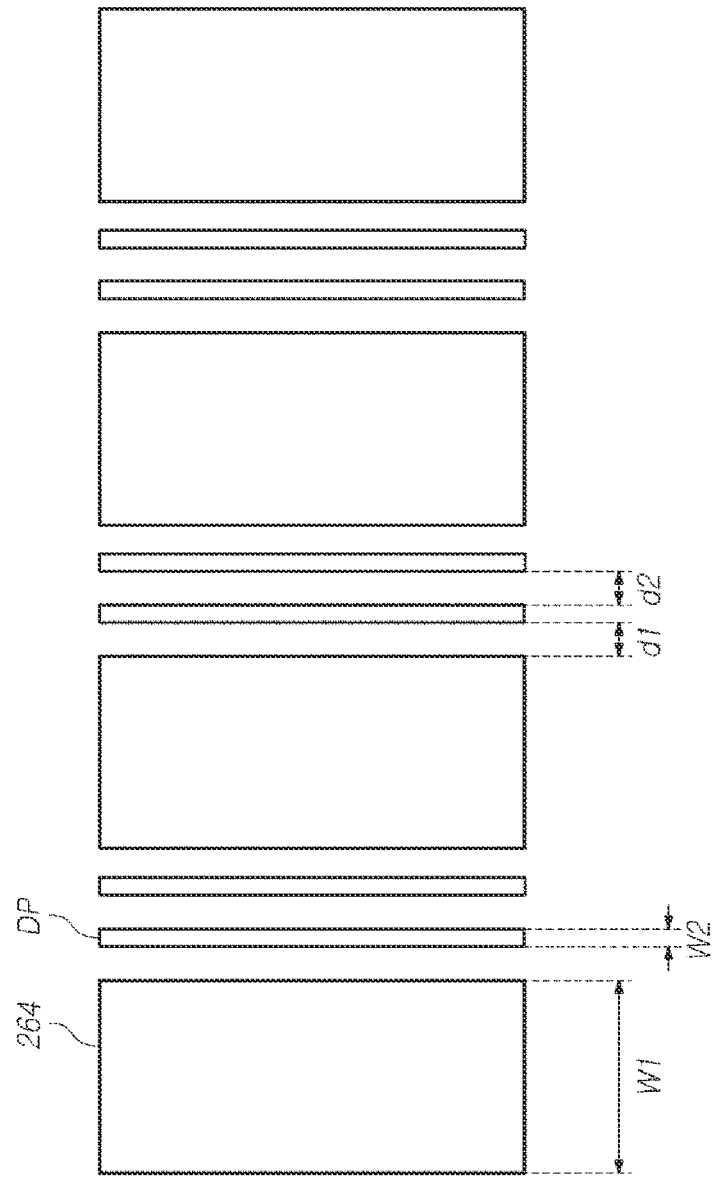

FIG. 7 illustrates the driving chip package DCP in which two dummy patterns DP are disposed between every pair of adjacent film lines 264.

Referring to FIG. 7, the width W2 of each dummy pattern DP is formed smaller than the width W1 of each film line 264 and is greater than the width W2 of the dummy pattern illustrated in FIG. 6. The distance d1 between each film line 264 and the adjacent dummy pattern DP may be identical with or different from the distance d2 between the adjacent dummy patterns DP.

Figure 8:
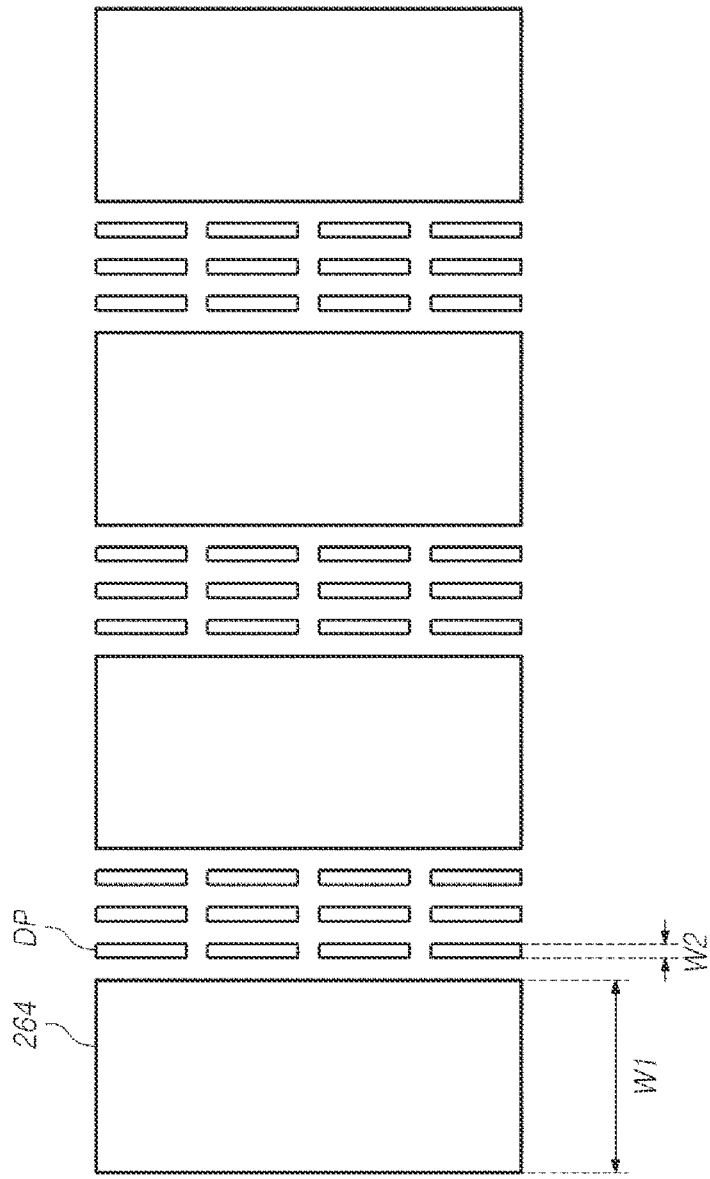

Referring to FIG. 8, three dummy patterns DP are present between every pair of adjacent film lines 264. Each of the dummy patterns DP includes a plurality of dummy pattern sections spaced apart from each other at predetermined distances. However, the dummy patterns DP according to this disclosure are by no means limited thereto, and a variety of other shapes and arrangements are possible.

Figure 9:
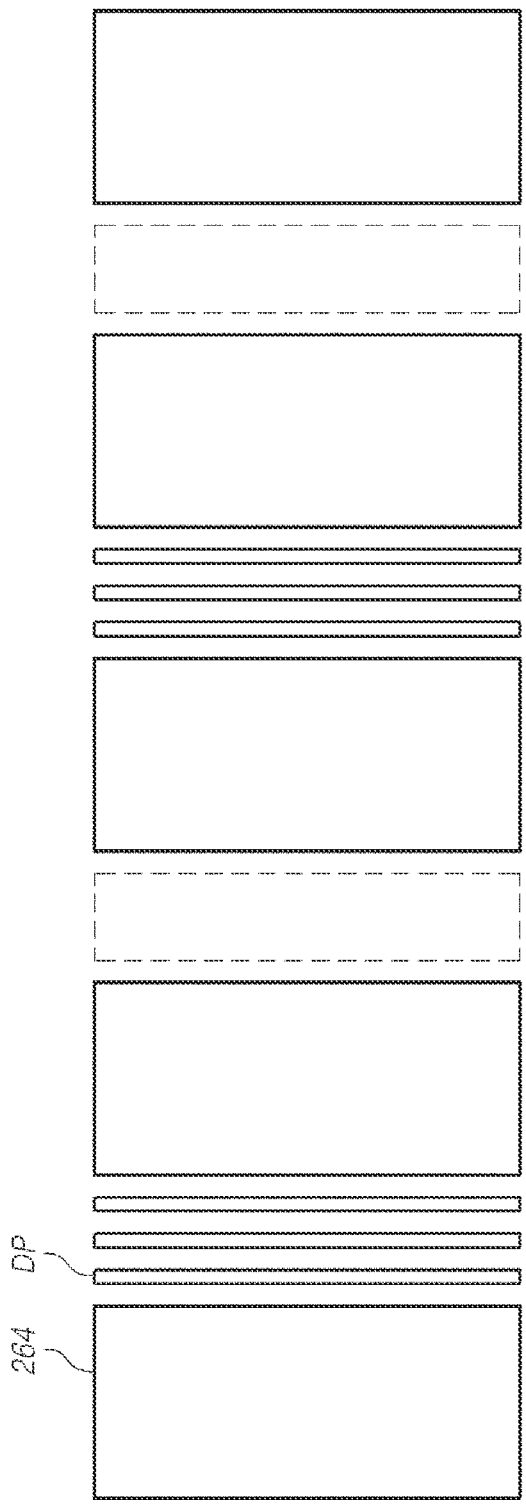

Referring to FIG. 9, dummy patterns DP may not be disposed between every pair of adjacent film lines 264. No dummy patterns are present between some pairs of adjacent film lines 264.

Referring to FIG. 10a and FIG. 10b, different numbers and shapes of dummy patterns DP are disposed between pairs of adjacent film lines 264.

Referring to FIG. 10a, the plurality of first dummy patterns DP1 are two pattern lines, and the plurality of second dummy patterns DP2 are two pattern lines, in which each second dummy pattern DP2 is divided into two sections. These patterns DP1 and DP2 may be repeatedly disposed. On the other hand, as illustrated in FIG. 10b, the first dummy pattern DP1 is formed as a single pattern line, and the plurality of second dummy patterns DP2 are formed as two pattern lines. These patterns DP1 and DP2 may be repeatedly disposed.

Figure 11:
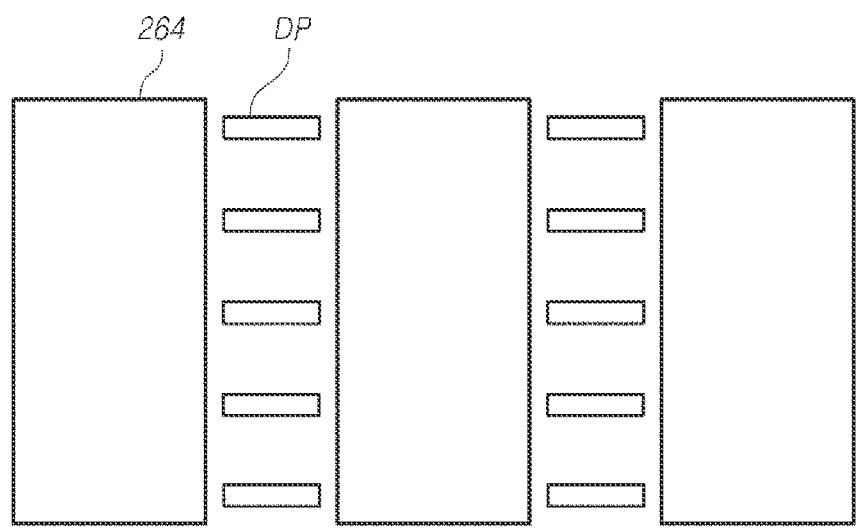

Referring to FIG. 11, the plurality of dummy patterns DP are arranged perpendicular to the film lines 264 instead of being parallel to the film lines 264. The width of the dummy patterns DP or the distance between each film line 264 and the adjacent dummy pattern DP may be designed variously.

It should be understood that the shapes (structures) and arrangements of the dummy patterns DP as described above are given only for the sake of explanation and the present invention is by no means limited thereto.

The effects of the driving chip package DCP and the display device 100 will now be described in more detail with reference to the accompanying drawings.

Figure 12A:
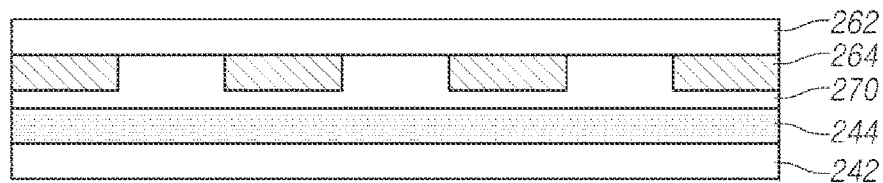
FIG. 12a and FIG. 12b are schematic cross-sectional views illustrating parts of the process of repairing a display panel and a driving chip package of a display device of the related art.
Figure 12B:
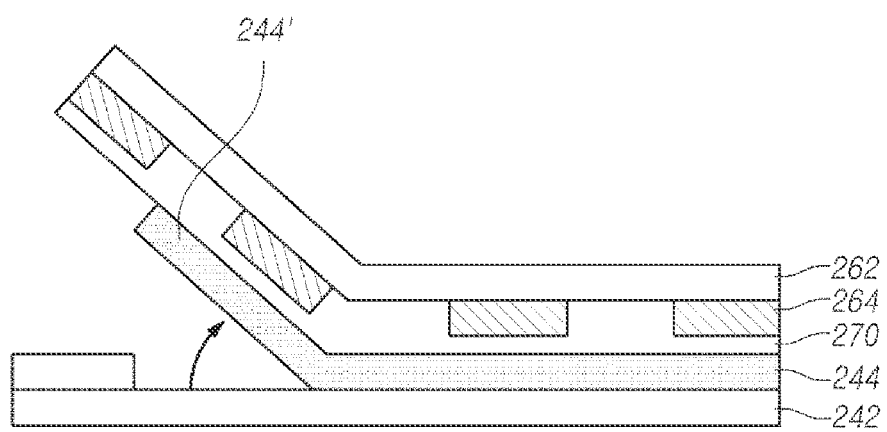
Figure 13A:
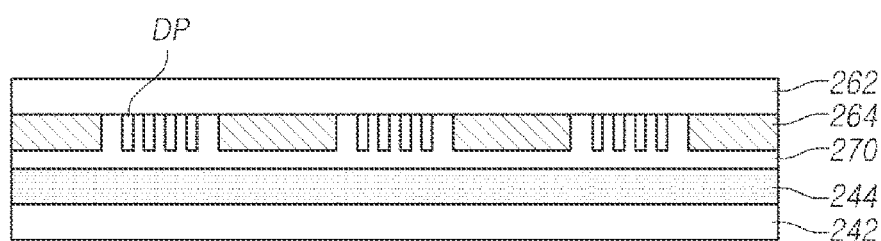
FIG. 13a and FIG. 13b are schematic cross-sectional views illustrating parts of the process of repairing a display panel and a driving chip package of a display device according to an exemplary embodiment of the present invention.
Figure 13B:
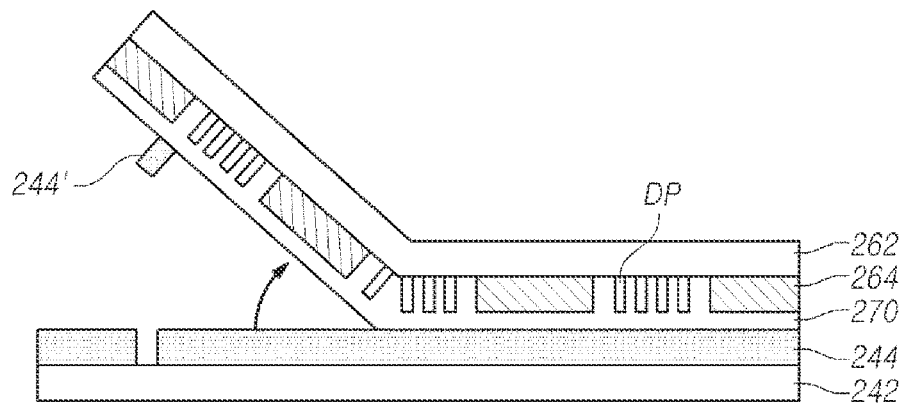

FIG. 12a and FIG. 12b are schematic cross-sectional views illustrating parts of the process of repairing a display panel and a driving chip package of a display device of the related art. FIG. 13a and FIG. 13b are schematic cross-sectional views illustrating parts of the process of repairing a display panel and a driving chip package of a display device according to an exemplary embodiment of the present invention.

Referring to FIG. 12a and FIG. 12b, the display device of the related art includes signal lines 244 disposed on a substrate 242, film lines 264 and a film 262 disposed on the signal lies 244, and a conductive adhesive 270 disposed between the film lines 264 and the signal lines 244.

In the process of repairing a driving chip package, the amount of the conductive adhesive 270 disposed in the spaces between the film lines 264 is greater than the amount of the conductive adhesive 270 disposed in the spaces between the film lines 264 and the signal lines 244. When the driving chip package is detached from the signal lines 244 during the repairing process, the signal lines 244 are detached from the substrate 242 along with the driving chip package. Consequently, the display panel 140 may malfunction or may suffer from a short circuit.

In contrast, referring to FIG. 13a and FIG. 13b illustrating the display device including a driving chip package according to an exemplary embodiment of the present invention, dummy patterns DP are disposed in the spaces between film lines 264.

The dummy patterns DP disposed between the film lines 264 can reduce the amount of a conductive adhesive 270 in the spaces between the film lines 264 compared to the display device of the related art. This can consequently prevent or reduce the signal lines 244 from being detached from the substrate during the repairing process.

When the driving chip package is detached from the substrate, a signal line 244 may be detached in an area in which a relatively large amount of the conductive adhesive 270 is contained. In this case, only a small amount of signal line 244' is detached since the bonding force is reduced in the area in which the dummy patterns DP are disposed. This can consequently reduce damage to the signal lines.

Although the exemplary embodiments have been described with reference to the accompanying drawings, the present invention is by no means limited thereto.

It will be understood that the terms "comprise," "include," "have," and any variations thereof used herein are intended to cover a non-exclusive inclusion unless explicitly described to the contrary. Unless otherwise defined, all terms including technical and scientific terms used herein have the same meaning as commonly understood by a person skilled in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present invention. A person skilled in the art to which the invention relates can make many modifications and variations without departing from the principle of the invention. The foregoing embodiments disclosed herein shall be interpreted as illustrative only but not as limitative of the principle and scope of the invention. It should be understood that the scope of the invention shall be defined by the appended Claims and all of their equivalents fall within the scope of the invention.

What is claimed is:

1. A display device comprising:
   a display panel comprising a bonding area in which signal lines are disposed; and
   a chip-on-film bonded to the display panel, the chip-on-film comprising:
      a film mounted with a driving chip, the film comprising a bonding portion adhered to the bonding area of the display panel using an adhesive material;
      a plurality of film lines on the film to carry signals to the signal lines on the display panel, the film lines extending to the bonding portion of the film;
      at least one dummy pattern on at least the bonding portion of the film and extending between a first pair of film lines in the plurality of film lines, the at least one dummy pattern electrically isolated from the plurality of film lines and electrically isolated from the signal lines on the display panel; and
      wherein the driving chip is mounted on a first surface of the film, and wherein the plurality of film lines and the at least one dummy pattern are disposed on a second surface of the film opposite the first surface, the second surface including the bonding portion of the film.

2. The display device according to claim 1, wherein the adhesive material is an anisotropic conductive film (ACF).

3. The display device according to claim 1, wherein one or more of the at least one dummy pattern is disposed between every pair of adjacent film lines in the plurality of film lines.

4. The display device according to claim 1, wherein a width of each of the film lines is greater than a width of the at least one dummy pattern.

5. The display device according to claim 1, wherein the at least one dummy pattern comprises at least two dummy patterns, and a distance between a film line in the first pair of film lines and a dummy pattern adjacent to the film line in the at least one dummy pattern is identical with a distance between an adjacent pair of dummy patterns in the at least one dummy pattern.

6. The display device according to claim 1, wherein the plurality of film lines are electrically connected to a printed circuit board.

7. The display device according to claim 1, wherein the plurality of film lines is electrically connected to signal lines on the display panel.

8. The display device according to claim 1, wherein the at least one dummy pattern is a line extending along a direction in which each of the plurality of film lines extends.

9. The display device according to claim 1, wherein the at least one dummy pattern comprises a plurality of dummy pattern sections spaced apart from each other along a direction in which each of the plurality of film lines extends.

10. The display device according to claim 1, wherein the at least one dummy pattern is a line extending along a direction perpendicular to a direction along which each of the plurality of film lines extends.

* * * * *